United States Patent
Wang et al.

(10) Patent No.: US 10,817,638 B2
(45) Date of Patent: Oct. 27, 2020

(54) METHOD AND APPARATUS FOR CAMOUFLAGING AN INTEGRATED CIRCUIT USING VIRTUAL CAMOUFLAGE CELLS

(71) Applicant: INSIDE SECURE, Meyreuil (FR)

(72) Inventors: Bryan J. Wang, South Lake Tahoe, CA (US); Lap Wai Chow, South Pasadena, CA (US); James P. Baukus, Westlake Village, CA (US); Ronald P. Cocchi, Seal Beach, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 16/364,056

(22) Filed: Mar. 25, 2019

(65) Prior Publication Data
US 2020/0311222 A1 Oct. 1, 2020

(51) Int. Cl.
*G06F 30/39* (2020.01)
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC .............................. G06F 30/398; G06F 30/392
USPC .................. 716/110, 118, 119, 122
See application file for complete search history.

(56) References Cited

U.S. PATENT DOCUMENTS

| | | | | |
|---|---|---|---|---|
| 3,199,547 A | * | 8/1965 | Knutson et al. | F41H 3/02 139/383 R |
| 7,613,907 B2 | * | 11/2009 | Kaabouch et al. | G06F 21/52 712/220 |
| 9,735,781 B2 | * | 8/2017 | Cocchi et al. | G06F 21/14 |
| 10,347,630 B2 | * | 7/2019 | Kuenemund | H01L 23/576 |
| 2008/0040593 A1 | * | 2/2008 | Kaabouch | G06F 21/52 712/244 |
| 2018/0341737 A1 | * | 11/2018 | Chow et al. | H03K 19/17736 |

* cited by examiner

*Primary Examiner* — Sun J Lin
(74) *Attorney, Agent, or Firm* — Gates & Cooper LLP

(57) ABSTRACT

A method and an apparatus for camouflaging an application specific integrated circuit are disclosed. The ASIC comprises a circuit comprising a plurality of interconnected functional logic cells performing a logical function. In one embodiment, the method comprises accepting a coded description of the circuit, wherein the coded description describes the circuit in terms of components comprising a sequential logic component and a virtual camouflage component, generating a logical description of the circuit, the logical description of the circuit comprising a logical description of the virtual camouflage component, and replacing, in the logical description of the circuit, the logical description of the virtual camouflage component with a logical description of a functionally equivalent technology-dependent camouflaged component.

21 Claims, 14 Drawing Sheets

302

```
reg A, B, Sum, Carry;
always @(A or B) begin
    {Carry,Sum} = A + B;
end

VCL_INST1 CAM00 (.I(Carry), .X0(B));

always @(posedge Clk) begin
    Sum_reg <= Sum;
    Carry_reg <= Carry;
end
```

RTL (Verilog) with VCL Cells
(Half adder (HA) with registered outputs)

RTL Design 204 →

→ Logic Synthesis 208

```
reg A, B, Sum, Carry;
wire C, D;
always @(A or B) begin
    {Carry,Sum} = A + B;
end
VCL_XOR2 CAMO1 (.Z(D), .A(Carry),
    .B(C));
always @(posedge Clk) begin
    Sum_reg <= Sum;
    Carry_reg <= D;
end
```

402

RTL (Verilog) with VCL Cells
(Half adder (HA) with registered outputs)

404

RTL Design 204 → Logic Synthesis 208

*FIG. 4A*

METHOD AND APPARATUS FOR CAMOUFLAGING AN INTEGRATED CIRCUIT USING VIRTUAL CAMOUFLAGE CELLS

BACKGROUND OF THE INVENTION

1. Field of the Invention

The present invention relates to systems and methods for designing digital circuits, and in particular to a system and method for designing camouflaged digital circuits.

2. Description of the Related Art

Integrated circuit (IC) designs are vulnerable to intellectual property (IP) theft from reverse engineering, unauthorized cloning and over-production, and device corruption due to Trojan insertion. The risks to the IC industry have been steadily increasing as reverse engineering capabilities increase, and as worldwide IC production capabilities consolidate into a small number of entities. IC designers can protect their circuit designs from these attacks using circuit camouflage. Normally, circuit camouflage is inserted into a circuit at the gate level netlist stage of the design flow, or even later. This limits the circuit designer's accessibility in selecting useful nodes in the design for camouflage insertion, as it is more difficult to identify specific nodes in the design's synthesized gate-level netlist than it is in the design's register transfer level (RTL) code. This also limits the ability to reuse camouflage insertion parameters across multiple technologies.

What is needed is a system and method for inserting camouflage technologies that resolves the foregoing limitations.

SUMMARY OF THE INVENTION

To address the requirements described above, the present invention discloses a method and apparatus for camouflaging an application specific integrated circuit (ASIC), wherein the ASIC comprises a circuit comprising a plurality of interconnected functional logic cells performing a logical function. In one embodiment, the method comprises accepting a coded description of the circuit, wherein the coded description describes the circuit in terms of components comprising a sequential logic component and a virtual camouflage component, generating a logical description of the circuit, the logical description of the circuit comprising a logical description of the virtual camouflage component, and replacing, in the logical description of the circuit, the logical description of the virtual camouflage component with a logical description of a functionally equivalent technology-dependent camouflaged component. Other embodiments are evidenced by a processor communicatively coupled to a memory storing processing instructions for performing the foregoing process steps.

BRIEF DESCRIPTION OF THE DRAWINGS

Referring now to the drawings in which like reference numbers represent corresponding parts throughout:

FIGS. 3A-3C are diagrams illustrating the design flow of using technology-specific cell replacement of undriven VCL cells;

FIGS. 4A-4C are diagrams illustrating the design flow of using technology-specific cell replacement of a driven VCL cells.

DETAILED DESCRIPTION OF PREFERRED EMBODIMENTS

Figure 1A:
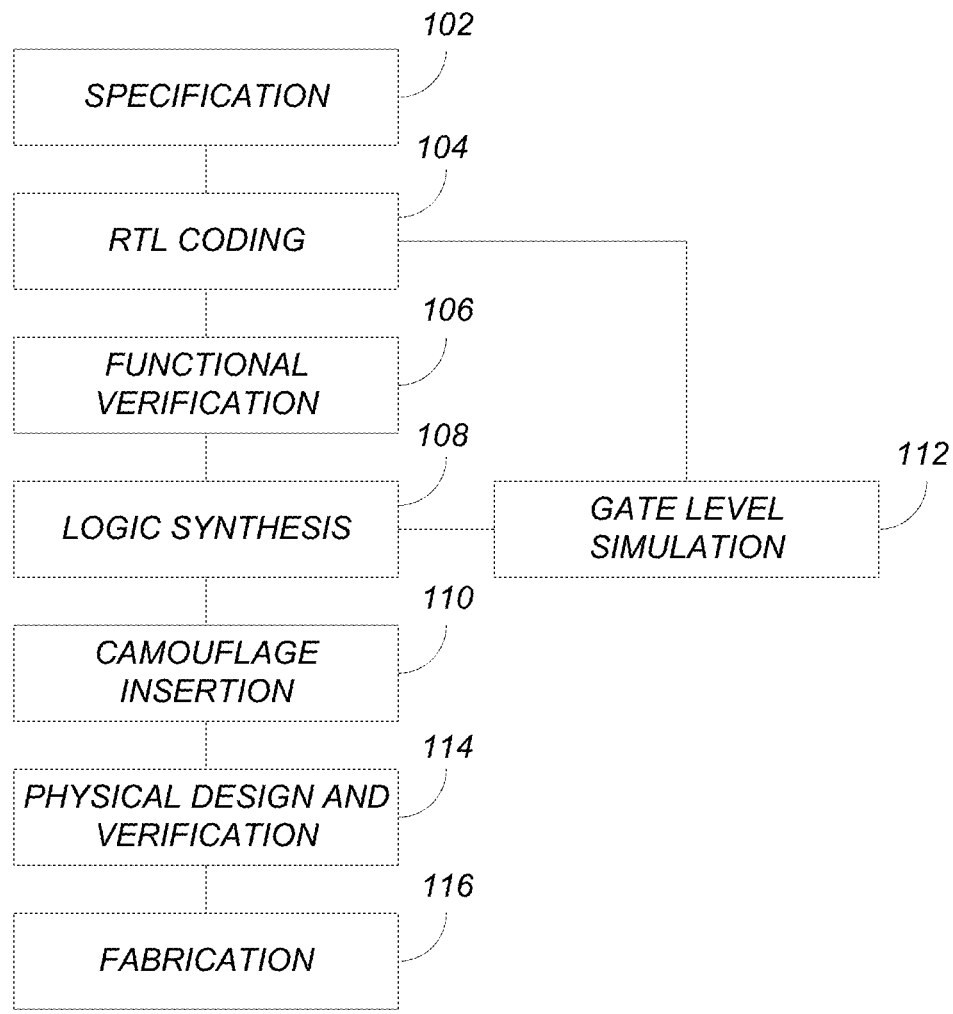
FIG. 1A is a diagram depicting a typical camouflaged ASIC design flow.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

A method to secure an IC using virtual camouflaged circuit components is presented below. This method allows hardware designers to use technology-independent virtual camouflage cells to specify how circuit camouflage will protect their IC. Because the virtual camouflage cells are technology-independent, they can be specified in the IC's high-level design models such as at the Register Transfer Level (RTL). A camouflage-inserted high-level design model is then be synthesized to a target technology, and technology-dependent camouflaged circuit components will be utilized as specified by the designer in the IC's high-level models. In this context, a camouflaged circuit component is referred to as "technology-dependent" when the physical structure or circuit topology of the camouflaged circuit used to implement a functionality using one particular technology differs from the physical structure or circuit topology used to obtain the same functionality using another technology. The technology differences include technology feature size, technology design rules, and the physical layouts of the non-camouflaged cells that are mimicked by the camouflaged cells.

There are several benefits of using virtual camouflage cells to incorporate camouflaged features into the IC's high-level design models. First, it allows designers greater accessibility in selecting useful nodes in the design for camouflage insertion. Because much of a design's nomenclature (module names, hierarchy, signal and register names) is lost during the synthesis process, it is easier to identify specific nodes in the design's RTL code than in the design's synthesized gate-level netlist. Second, it improves reuse of the camouflage insertion parameters across multiple technologies. Since the camouflage insertion parameters are specified by the design's RTL code's instantiation of virtual camouflage cells, reuse across technology libraries requires no additional effort from designers.

Circuit Camouflage Technology

Circuit camouflage technology is a type of hardware obfuscation that encompasses the design and use of camouflaged logic gates whose logical function is difficult to determine using conventional reverse engineering techniques. The text and diagrams of this invention utilize a style of camouflaged gate whose apparent physical design mimics that of a conventional logic gate of the standard cell library used to design the IC, but the camouflaged gate's actual logic function differs from that of the mimicked logic gates. This is the most prevalent type of camouflaged gate in use today. The camouflaged circuit contains a number of camouflaged gates among a sea of normal gates, and a netlist extracted with conventional reverse engineering techniques will contain a number of discrepancies proportional to the number of camouflaged gates used in the circuit. The number and location of the camouflaged gates is not apparent to the reverse engineer. The abbreviated term "camo" may be used in place of "camouflage" or "camouflaged" throughout this document.

Camouflaged ASIC Design Flow

Designers utilize a design flow comprised of electronic design automation (EDA) tools to accomplish the design of an application-specific integrated circuit (ASIC). A camouflaged ASIC design flow contains the additional step of Camouflage Insertion, a process by which camouflaged cells are inserted into the ASIC design.

FIG. 1A is a diagram depicting a typical design flow for a camouflaged ASIC. The process begins with a design specification (e.g. a document or requirement that specifies the desired function and characteristics of the ASIC), as shown in block 102. The specified hardware is designed and verified using Register Transfer Level (RTL) modeling, as shown in blocks 104 and 106. This process is and remains technology-independent until the Logic Synthesis process depicted in block 108 is performed. Logic Synthesis iteratively transforms technology-independent RTL models into a technology-specific gate-level netlist. Designers then perform a gate level simulation 112 and use the results of the simulation to update the RTL coding of block 104. Next, the Camouflage Insertion step of block 110, connects technology-specific camouflaged logic cells into the gate-level netlist. The cells of the gate-level netlist are then placed and routed in the physical design and verification step shown in block 114 before the fabrication step of block 116. Traditionally, Camouflage Insertion 110 is performed after Logic Synthesis because camouflaged cells are, by necessity, technology-specific.

Figure 1B:
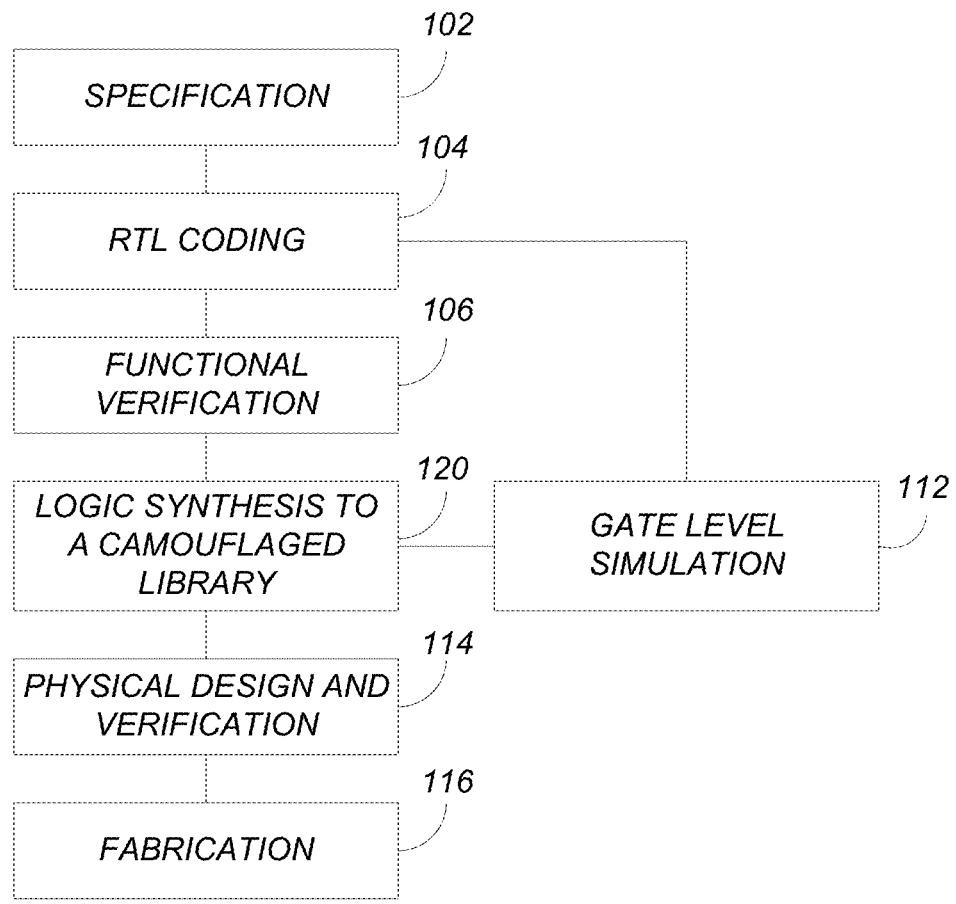
FIG. 1B is a diagram depicting a camouflaged ASIC design flow involving synthesis to a camouflaged cell library.

FIG. 1B is a diagram depicting a variant of the flow described in FIG. 1A, in which the Logic Synthesis 108 and Camouflage Insertion 110 steps are merged by synthesizing the design's RTL models to a camouflaged logic cell library, as shown in block 120, incorporating the gate level simulation 112 into the iterative loop. This variant requires a functionally complete camouflaged library including sequential and combinational cells.

Figure 1C:
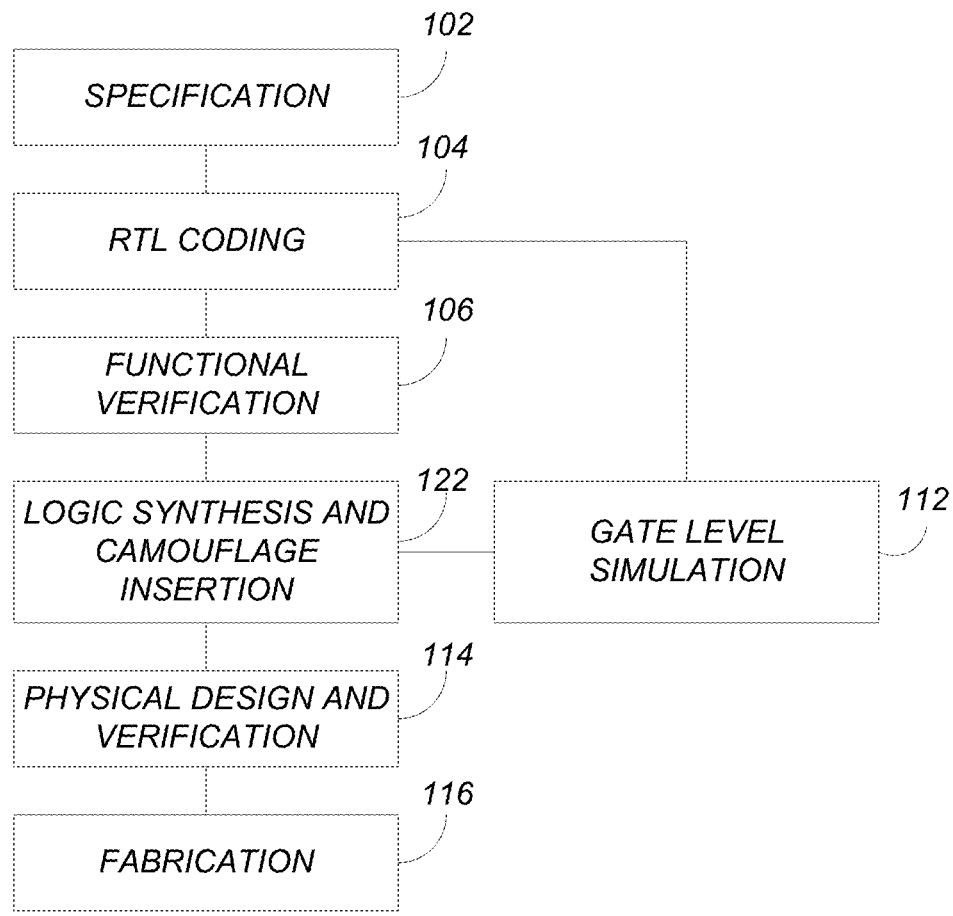
FIG. 1C is a diagram depicting a camouflaged ASIC design flow merging logic synthesis and camouflage insertion to one run.

FIG. 1C is a diagram depicting another variant of the flows described in FIGS. 1A and 1B. This variant merges the Logic Synthesis 108 and Camouflage Insertion 110 steps by performing logic synthesis followed by camouflage insertions serially in one run, as shown in block 122. The camouflage insertion step remains technology-specific in all variants illustrated in FIGS. 1A-1C.

Camouflaged ASIC Design Flow with Virtual Camouflage Cells

Figure 2:
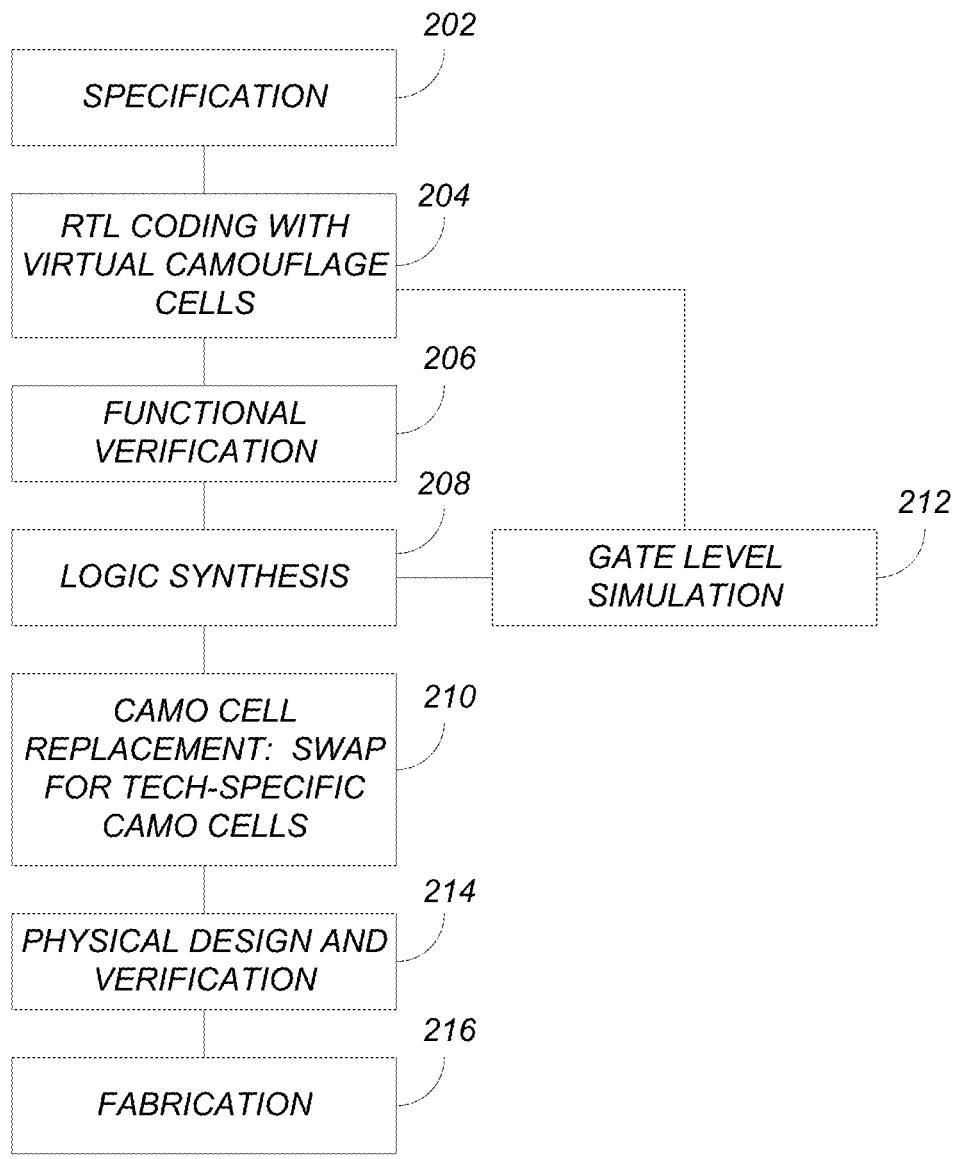
FIG. 2 is a diagram depicting an improved camouflaged ASIC design flow with a technology independent RTL.

FIG. 2 is a diagram depicting an improved camouflaged ASIC design flow with a technology-independent RTL code that supports camouflaged circuitry. This flow also begins with the design specification 202, but differs from the flow illustrated in FIGS. 1A-1C in that it allows for camouflage features to be designed into an IP block at the RTL level, which is the standard level at which IC hardware IP is maintained. This is advantageous because, as is illustrated below, RTL models are technology-independent and more "readable" by designers. Further, specification of circuit camouflage components can be done once for an ASIC or an IP block (a reusable unit of logic, cell, or integrated circuit layout design that is the intellectual property of one party), and then reused many times across many technologies.

In the improved design flow, the "Camouflage Insertion" step 110 from FIG. 1A is merged with the "RTL Coding" step 104, and a new "Camo Cell Replacement" step 210 is added. The "RTL Coding with Virtual Camouflage Cells" step 204 involves a designer inserting virtual camouflage cells into the design's RTL code. The "Camo Cell Replacement" step 210 is a fully automated step that replaces the virtual camouflage cells with technology-dependent camouflage components.

The use of virtual camouflage cells in a design's RTL code does not imply a requirement that the design must undergo the camouflage cell replacement process. There are several ways that virtual camouflage cells may be safely removed from a design that is not intended to contain technology-specific camouflage cells. A first method is to apply the appropriate constraints and library models to the Logic Synthesis process such that the virtual camouflage cells are optimized out by the synthesis tool, leaving no trace of them in the synthesized netlist. A second method is to use a preprocessing language to conditionally insert the camouflage components in the design's high-level code, allowing the designers to generate versions both with and without the virtual camouflage cells. Other methods may be possible. These methods to remove virtual camouflage cells from a design are based on well-known design methodologies.

Virtual Camouflage Cells and the Virtual Camouflage Library (VCL)

Virtual camouflage cells are technology-independent logic cells that are organized into a cell library, which shall be called a Virtual Camouflage Library (VCL). The cell library contains all models required to support the Frontend portions of an ASIC design flow (the steps up to and including Logic Synthesis 208). Designers may instantiate components from the VCL in RTL designs in the same way that they instantiate any other IP block.

Virtual camouflage cells, referred to as VCL cells, are modeled as logic cells, and include two varieties: driven VCL cells and undriven VCL cells. Driven VCL cells have outputs which may be "stuck-at" $V_{DD}$ or $V_{SS}$ (e.g. configured so that they are always at a particular logic level or voltage, regardless of input), or they may be a logical function of cell inputs. VCL cells with "stuck-at" outputs or outputs that are the logic functions of cell inputs may be used in the design to specify the design's behavior. Undriven VCL cells have one or more camouflage inputs. A camouflage input may be connected to a node (wire) in the circuit to specify that node for camouflage protection. During the Camo Cell Replacement step 210, these virtual camouflage cells will be replaced with compatible (functionally equivalent) technology-specific camouflaged circuits. Undriven VCL cells have no outputs when instantiated in RTL, but are replaced during Camo Cell Replacement step 210 with technology-specific camouflaged circuits that have outputs that actively protect the circuit. VCL cells may have one or more "don't-care inputs," which do not affect the output of the VCL cell or the technology-specific camouflage circuit that will eventually replace the VCL cell. Don't-care inputs are optionally used by the designer to specify connections to the camouflage circuit to mislead reverse engineers to believe that the camouflage circuit is a logic function of specific nodes in the circuit.

The instance name of the VCL cell may be used to store camouflage insertion parameters for use during the camouflage cell replacement process. Potentially useful parameters include but are not limited to specification of a set of cells whose nodes must receive the same camouflaged circuit, and the specification of the likelihood that a VCL cell with an unspecified output value will be replaced by a camouflaged circuit with a specified output polarity (i.e. 40%/60% chance of $V_{DD}/V_{SS}$, or 10%/90% chance of $V_{DD}/V_{SS}$).

Logic Synthesis Using the VCL

The logic synthesis step of a conventional process (e.g. steps 120 or 122) converts an RTL model into a gate-level netlist, which is typically technology-specific. The logic synthesis step 208 and gate level simulation step 212 illustrated in FIG. 2 uses an RTL model that contains VCL cells, and undergoes the similar logical synthesis process. This logical process differs in that the VCL cells are modeled to contain a "don't-touch" attribute, which indicates that the VCL cells will not be subject to logic synthesis, restructuring, or optimization performed on non-VCL cells and structures in the RTL model. If the RTL model contains components from a VCL, all logic that is not "don't-touched" is synthesized into gate-level components, and any "don't-touched" logic (i.e. VCL components) are preserved. The result is a technology-specific gate-level netlist that still contains some VCL cells. This netlist is referred to as a Pre-Replacement Netlist. The VCL cells are then connected to components of the pre-replacement gate-level netlist in the same way that they were connected to signals of the RTL model.

Note that if the designer wishes to remove the VCL cells instead of proceeding with a camouflaged design flow, the designer may simply remove the "don't-touch" attribute from the VCL cells and the logic synthesis tool will remove all the VCL components during logic synthesis.

Camouflage Cell Replacement

The Camo Cell Replacement step 210 illustrated in FIG. 2 is an automated process that replaces technology-independent VCL components with technology-specific camouflage circuits. Each VCL cell in the Pre-Replacement Netlist is automatically replaced with a compatible (functionally equivalent) technology-specific camouflaged circuit. The technology-specific camouflaged circuit will be connected to the gate-level netlist in a similar way to how the VCL cell was connected to the RTL model, and subsequently to how the VCL cell was connected to the pre-replacement gate level netlist. Additional signals may be selected at random (or other method) to be connected to the technology-specific camouflage circuit. The camouflage cell replacement step 210 for driven VCL cells differs from the replacement step 210 for a non-driven VCL cell.

Camouflage cell replacement 210 for driven VCLs includes the steps of (1) swapping a driven VCL cell with a functionally equivalent technology-specific camouflaged circuit, and (2) choosing additional nodes within the design to connect any additional unconnected don't care inputs. These steps can be performed, for example, using a netlist editing program. Examples of such functionally equivalent camouflaged circuits and elements are disclosed, for example, in U.S. Pat. No. 9,735,781, by Lap Wai Chow, James P. Baukus, Bryan J. Wang, and Ronald P. Cocchi, filed Dec. 30, 2015, hereby incorporated by reference herein.

Camouflage cell replacements 210 for undriven VCL cells comprises a swap and merge technique. First the driver of the net (wire) that connects to the VCL cell's input is located. This driver is given a name (in this example, the name "original_driver"). Next, the loads of the same net are located, and also given a name (in this example, "original_loads"). Then, the original_driver is disconnected from the original_loads. An undriven VCL cell is then swapped with a technology-specific camouflaged circuit that drives a constant value of $V_{DD}$ or $V_{SS}$. Again, examples of such camouflaged circuits and elements are disclosed, for example, in U.S. Pat. No. 9,735,781, referenced above. Next a logic gate is instantiated to serve as a merge function. Appropriate logic functions for the merge function include but are not limited to AND2 or XNOR2 for a camouflaged circuit that drives $V_{DD}$, and include but are not limited to OR2 and XOR2 for a camouflaged circuit that drives $V_{SS}$. Next, the output of the technology-specific camouflaged circuit is connected to one input of the merge function. Then, the original_driver is connected to the other input of the merge function. The merge function's output (which represents the camouflaged_signal) is then connected to the original_loads. Finally, additional nodes are chosen with the design to hook up any further unconnected don't-care inputs of the camouflaged circuits.

Physical Design & Verification

Referring back to FIG. 2, after the Camouflage Cell Replacement of step 210, the netlist contains technology-specific logic gates and technology-specific camouflage cells. Next, the physical design and verification step 214 proceeds in the standard fashion, using technology-specific physical and logical models for the conventional logic cell library and the camouflaged logic cell library. To prevent camouflaged cells from being optimized out of the design, technology-specific camouflage cells include a "don't-touch" attribute that prevents such cells from being modified, and a "black-box" attribute to prevent physical design tools from knowing the logical function of the cells for the remainder of the design flow. The aforementioned tools include floorplanning and placement tools, which assign physical locations to logic cells, and routing tools, which connect the pins of different cells with wires and vias according to the connectivity specified in the design's netlist. These tools typically have the ability to modify (optimize) logic cells to meet timing, electrical, and other design constraints.

Exemplary Camouflage Circuit Insertion

FIGS. 3A-3C and 4A-4C are diagrams illustrating a camouflaged design flow using technology-specific cell replacement of undriven and driven VCL cells. In such examples, the hardware description is coded in the Verilog hardware description language (HDL).

Undriven Camouflage Cell Insertion

Figure 3B:
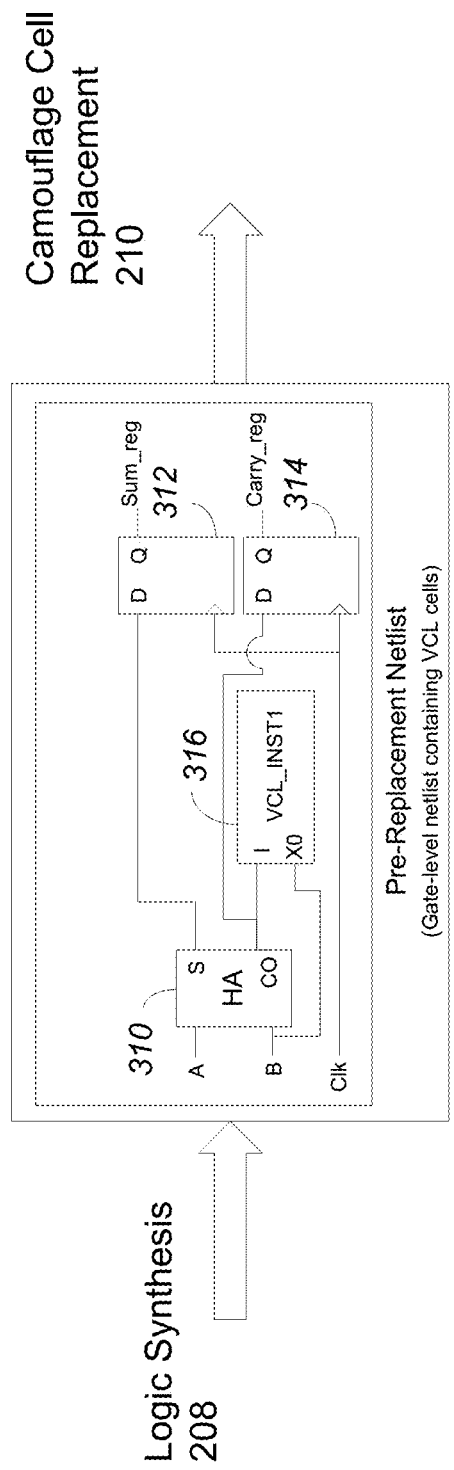
Figure 3C:
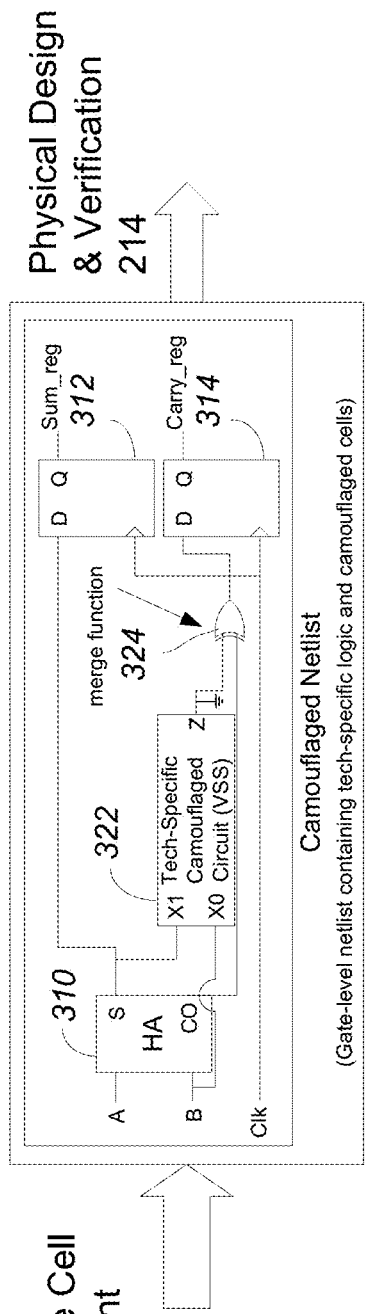

FIG. 3A-3C are diagrams illustrating the design flow of using technology-specific cell replacement of undriven VCL cells, illustrating the steps of RTL Design (coding) 204, Logic Synthesis 208, and Camouflage Cell Replacement 210 as applied to an exemplary circuit specified in RTL and synthesized into technology-specific camouflaged netlist. The example circuit is a registered half-adder.

FIG. 3A is a diagram of the RTL (Verilog) description 302 of the registered half adder. The registered half adder includes a description of a half adder "reg, A, B, Sum, Carry" where A and B are the inputs, Sum and Carry are the outputs. The sum output is provided to a summation register "Sum_reg" and the carry output is provided to a carry register "Carry_reg." As indicated in the RTL, the sum register and carry register are clocked by the positive edge of a clock (Clk) signal. The designer has also included an RTL (e.g. Verilog) description of a VCL cell 304, as indicated by the entry "VCL_INST1 CAMO0 (.I(Carry), .X0 (B))". This RTL description of the VCL cell 304 indicates the insertion of a VCL camouflage element with the input coupled to the carry output of the half adder and an X0 input coupled to input B. No output has been provided. Once the RTL coding with the VCL cells is complete, and functionally verified 206, logic synthesis 208 is then performed on the verified RCL coding to obtain a pre-replacement gate level netlist 308. The half adder or components thereof may be coupled to other circuits, including combinational logic or sequential logic circuits using other RTL coding.

FIG. 3B is a diagram depicting a pre-replacement netlist 308 (gate level netlist having the VCL cells) obtained from the RTL coding illustrated in FIG. 3A. This representation visually depicts the elements of the circuit and their interconnections. As illustrated, the registered half adder comprises a half adder 310 having input A and input B. The sum (S) output of the half adder 310 is communicatively coupled to the input of a delay flip flop 312. The carry (CO) output of the half adder 310 is communicatively coupled to an input of a second delay flip flop 314. A clock signal (CLK) is provided to a clock input of the first flip flop 312 and the second flip flop 314. VCL cell 316 having no output (undriven VCL cell VCL_INST1) has an input I coupled to the carry output of the half adder 310 and an X0 input communicatively coupled to input B. The RTL designer inserted an undriven VCL cell (VCL_INST1) 316 to protect the Carry output (CO) of the half-adder 310.

The logic synthesis step 208 synthesized the RTL into technology-specific gates, but it did not touch the VCL_INST1 component 304. The resulting pre-replacement netlist 308 contains the VCL cell 316. In the camouflage cell replacement step 210, undriven VCL cells such as VCL 316 undergo the Swap & Merge technique described above.

FIG. 3C is a diagram depicting the camouflaged netlist resulting from the camouflage cell replacement step 210. A technology-specific camouflaged circuit 322 replaces the VCL cell 316 and has an additional don't-care input X1 that is connected to the Sum output of the half-adder 310, a node which was chosen at random. A newly-instantiated XOR gate 324 merges the output of the camouflage circuit 322 with the output of the original driver, the CO output of the half adder 310. The technology-specific camouflaged circuit 322 drives a constant value of logic-0, but its layout suggests that it performs a different logic function. The output of the merge function gate (the output of XOR gate 324) represents the camouflaged signal. The output of the merge function gate 324 is now protected from reverse engineering by the camouflage circuit 322 because the correct function of the camouflage circuit 322 must be extracted for the camouflaged signal to have the correct value. The resulting camouflaged netlist 320 illustrated in FIG. 3C is ready to undergo physical design and verification.

Driven Camouflage Cell Insertion

Figure 4B:
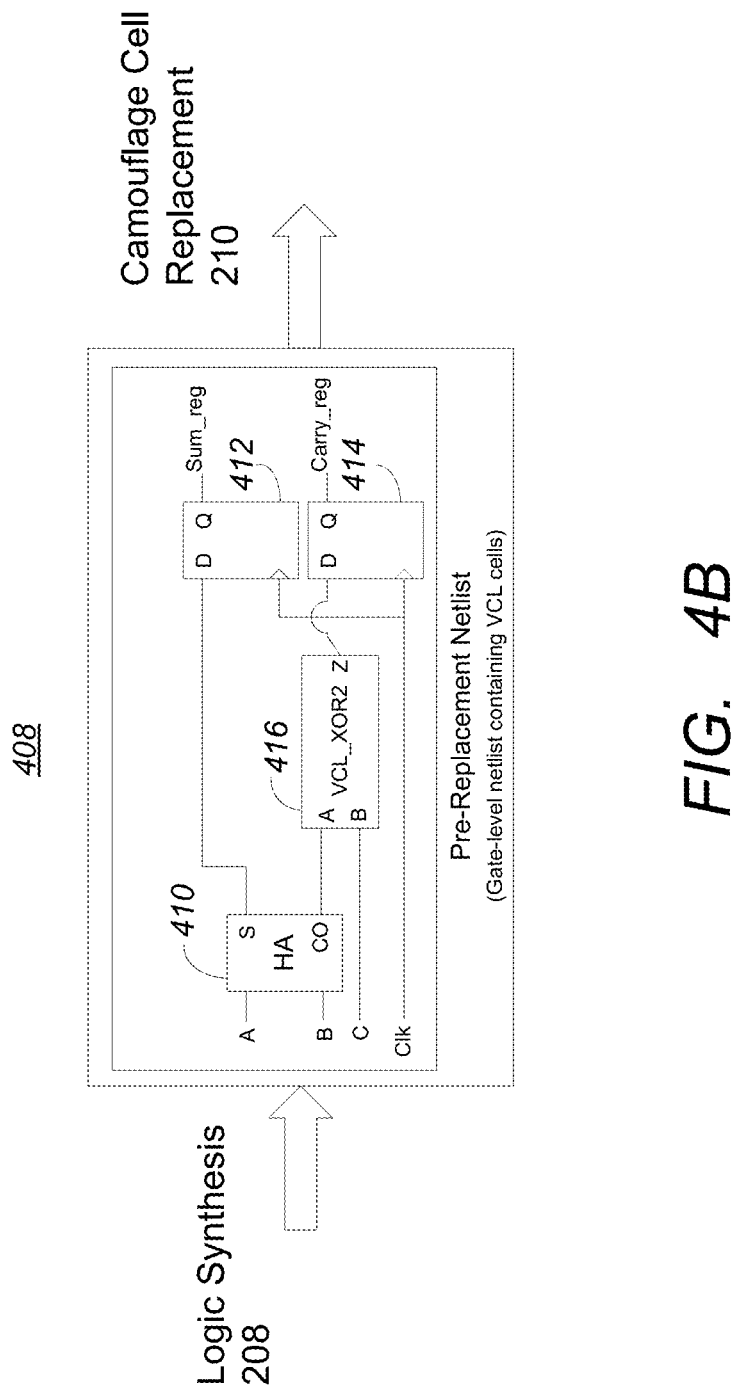
Figure 4C:
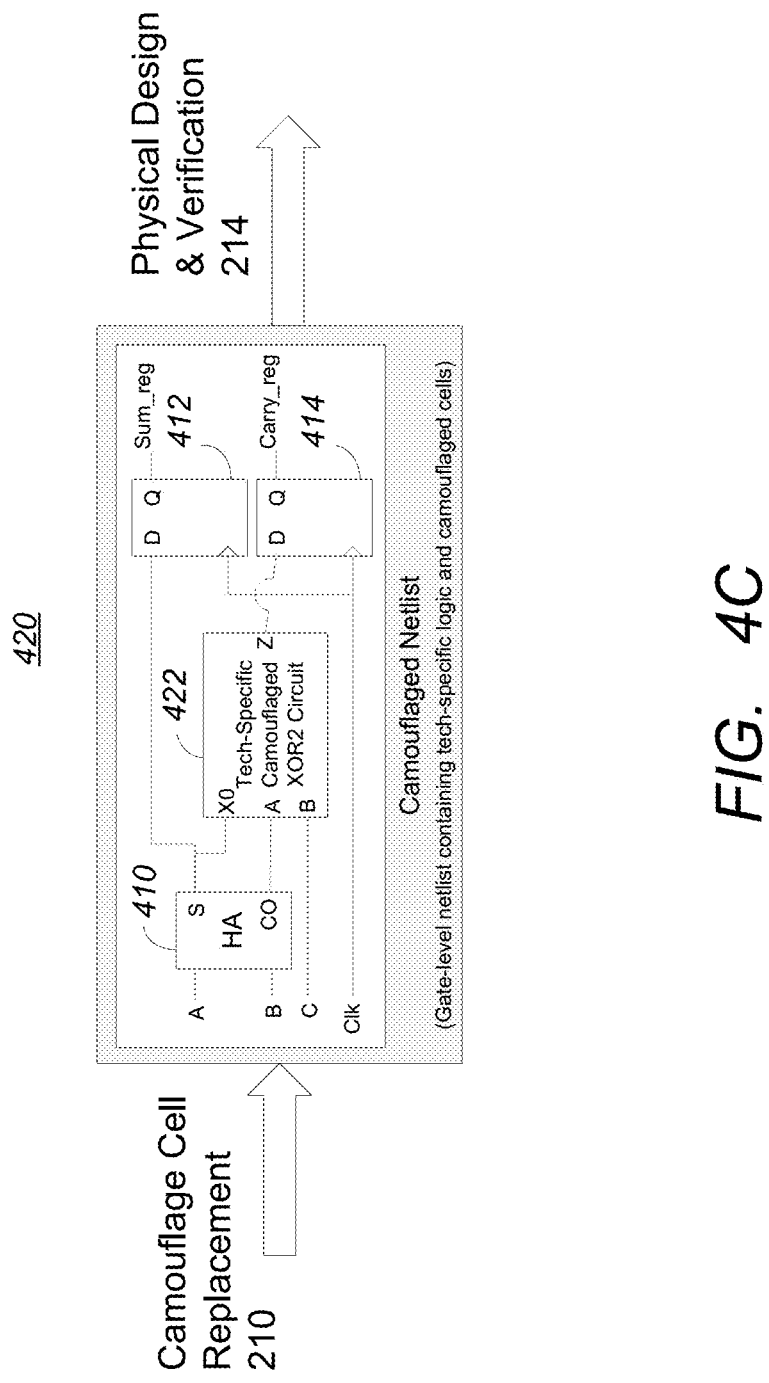

FIG. 4A-4C are diagrams illustrating the design flow of using technology-specific cell replacement of driven VCL cells, illustrating the steps of RTL Design (coding) 204, Logic Synthesis 208, and Camouflage Cell Replacement 210 as applied to an exemplary circuit specified in RTL and synthesized into technology-specific camouflaged netlist 420. The example circuit is a registered half-adder with the carry bit XORed with an additional input C. The RTL designer specified the XOR2 function to be a camouflaged function by instantiating the VCL cell (VCL_XOR2) perform the logical XOR.

FIG. 4A is a diagram illustrating a Verilog RTL description 402 specifying the foregoing circuit. The RTL description 402 includes an RTL Verilog description 402 of a half adder "reg, A, B, Sum, Carry" where A and B are the inputs, Sum and Carry are the outputs. "C" is an additional signal from elsewhere in the circuit (which may be considered as an input to the circuit of the RTL description 402). "C" is XORed with the carry (CO) output of half adder. "D" represents the output of the camouflaged XOR2 gate. The sum output is provided to a summation register "Sum_reg" and the carry output is provided to the A input of VCL_XOR2 cell 404. As indicated in the RTL, the sum register and carry register are clocked by the positive edge of a clock (clk) signal. The designer has also included an RTL (e.g. Verilog) description of a VCL cell 404, as indicated by the entry "VCL_XOR2 CAMO1 (.Z(D), .A(Carry), .B(C))". This RTL description of the VCL cell 304 indicates the insertion of a VCL camouflage element with the input A coupled to the carry output of the half adder and an B input coupled to the additional input C, and an output Z coupled to the D input of the carry register "Carry_reg". Once the RTL coding with the VCL cells is complete, and functionally verified 206, logic synthesis 208 is then performed on the verified RTL coding to obtain a pre-replacement gate level netlist.

FIG. 4B is a diagram depicting a resulting pre-replacement netlist 408. Note that again, the logic synthesis step synthesized the RTL into technology-specific gates, but it did not touch the VCL_XOR2 component 404. The resulting pre-replacement netlist 408 contains the VCL cell 416, half adder 410 and registers 412 and 414.

In the camouflage cell replacement step, the VCL cell undergoes the Swap technique described above for driven VCL cell 416, during which a compatible technology-specific camouflaged circuit 422 performing and XOR2 function replaces the VCL XOR2 cell 416.

FIG. 4C is a diagram illustrating the camouflaged netlist resulting of the camouflage cell replacement step. The technology-specific circuit 422 has an additional don't-care input X0, which is connected to the Sum output of the half-adder 410, a node which was chosen at random. The technology-specific camouflaged circuit 422 performs an XOR2 logic function, but its layout suggests that it performs a different logic function. The output (Z) of the tech-specific camouflaged circuit 422 is now protected from reverse engineering by the camouflage circuit 422 because the correct function of the camouflage circuit 422 must be extracted for the camouflaged signal Z to have the correct value. The resulting camouflaged netlist is ready to undergo the physical design and verification steps 214, and ultimately, the fabrication step 216.

Figure 5A:
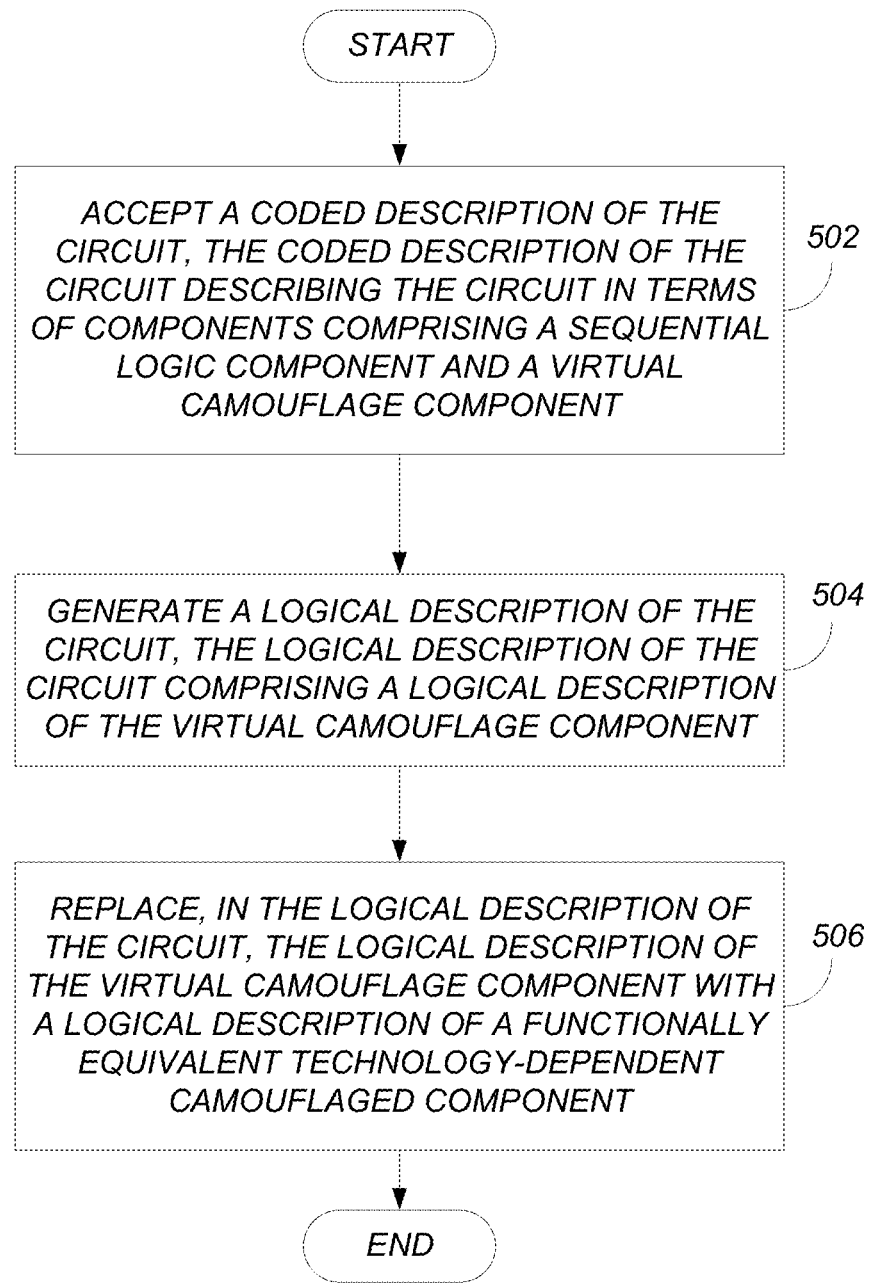
FIGS. 5A-5C is a diagram illustrating exemplary process steps that can be used to camouflage an application specific integrated circuit (ASIC)

FIG. 5A is a diagram illustrating exemplary process steps that can be used to camouflage an application specific integrated circuit (ASIC), wherein the ASIC comprises a circuit comprising a plurality of interconnected functional logic cells performing a logical function.

In block 502, a coded description of the circuit is accepted. The coded description describes the circuit in terms of components comprising at least one sequential logic component such as a flip flop and at least one technology-independent virtual camouflage component that can be selected from a virtual camouflage library (VCL) having a plurality of VCL cells including a driven VCL cell or an undriven VCL cell. An exemplary coded description is the RTL 302, 402 presented in FIGS. 3A and 4A. In block 504, a logical description of the circuit is generated, the logical description comprising a logical description of the virtual camouflage component such as items 316 and 416. An exemplary logical description is illustrated in FIGS. 3B and 4B in the form of pre-camouflage cell replacement netlists 308 and 408. In block 506, the logical description of the virtual camouflage component 316, 416 in the logical description of the circuit is replaced with a logical description of a functionally equivalent technology-dependent camouflaged component 322, 422. This results in a camouflaged netlist such as the camouflaged netlists shown in FIGS. 3C and 4C.

In one embodiment, the process of generating the logical description of the circuit 302, 402, as shown in block 504 comprises generating a technology specific pre-replacement netlist 308, 408 of gate-level components of the circuit including a logical model of the virtual camouflage component 316, 416. Further, the process of replacing the logical description of the virtual camouflage component 316, 416 with a functionally equivalent technology dependent camouflaged component 322, 422 comprises replacing, in the technology specific pre-replacement netlist 308, 408 of gate-level components, the logical model of the virtual camouflage component with a gate-level model 322, 422 of the functionally equivalent technology dependent camouflaged component. The generation of the logical description of the circuit described in block 504 may comprise any one of more of logic synthesis, restructuring, and optimization of the coded description of the circuit, and in such case, the virtual camouflage component includes an attribute that excludes the virtual camouflage component from the logic synthesis, restructuring or optimization processes.

Figure 5B:
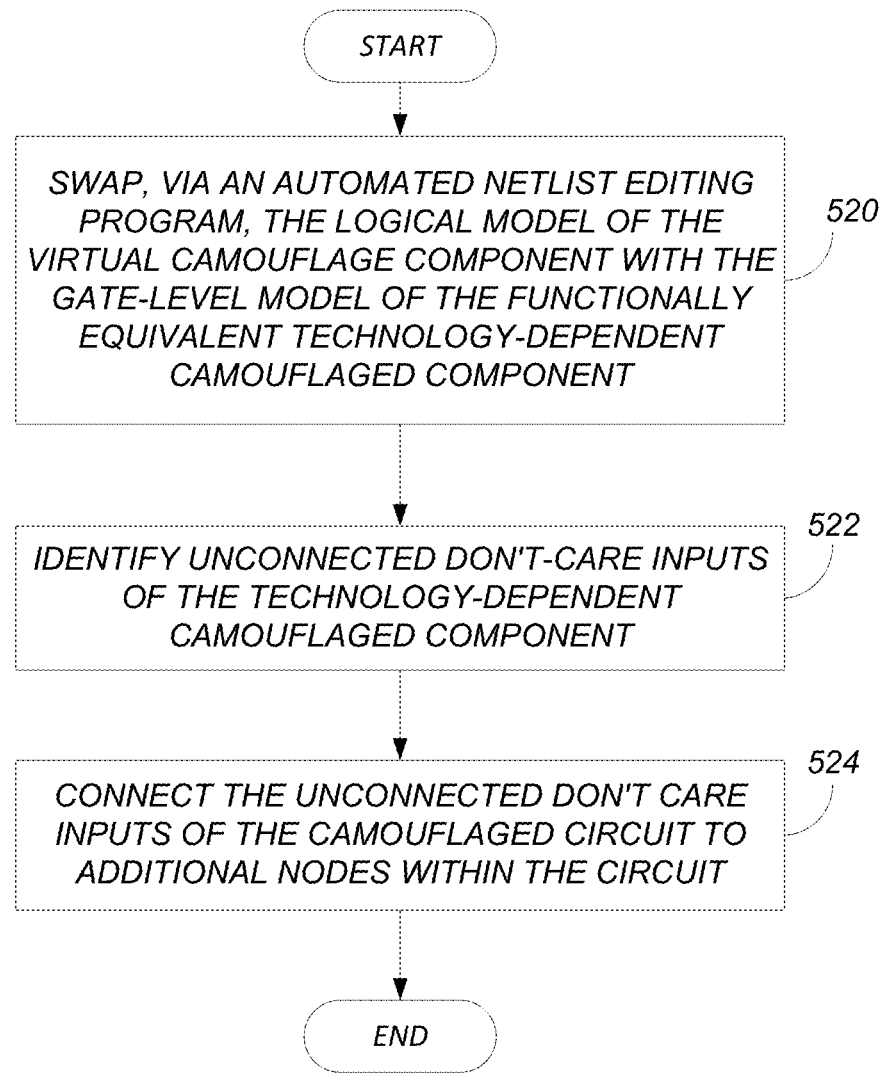

FIG. 5B is a diagram illustrating exemplary process steps used to replace the logical model of the virtual camouflage component with a gate level model of the functionally equivalent technology-dependent camouflaged component in cases where the virtual camouflage component is a driven VCL cell. This embodiment is analogous to the example presented in FIGS. 4A-4C above. In block 520, the logical model of the virtual camouflage component 416 is swapped with a gate-level model of the functionally equivalent technology-dependent camouflaged component 422. In one embodiment, this is accomplished using an automated netlist editing program. In block 522, unconnected don't care inputs (e.g. X0 in FIG. 4C) of the technology dependent camouflaged component 422 are identified, and in block 524, the identified unconnected don't care inputs of the camouflaged circuit are connected to additional nodes within the circuit (e.g. output S of half adder 410 and input D of sum register 412).

Figure 5C:
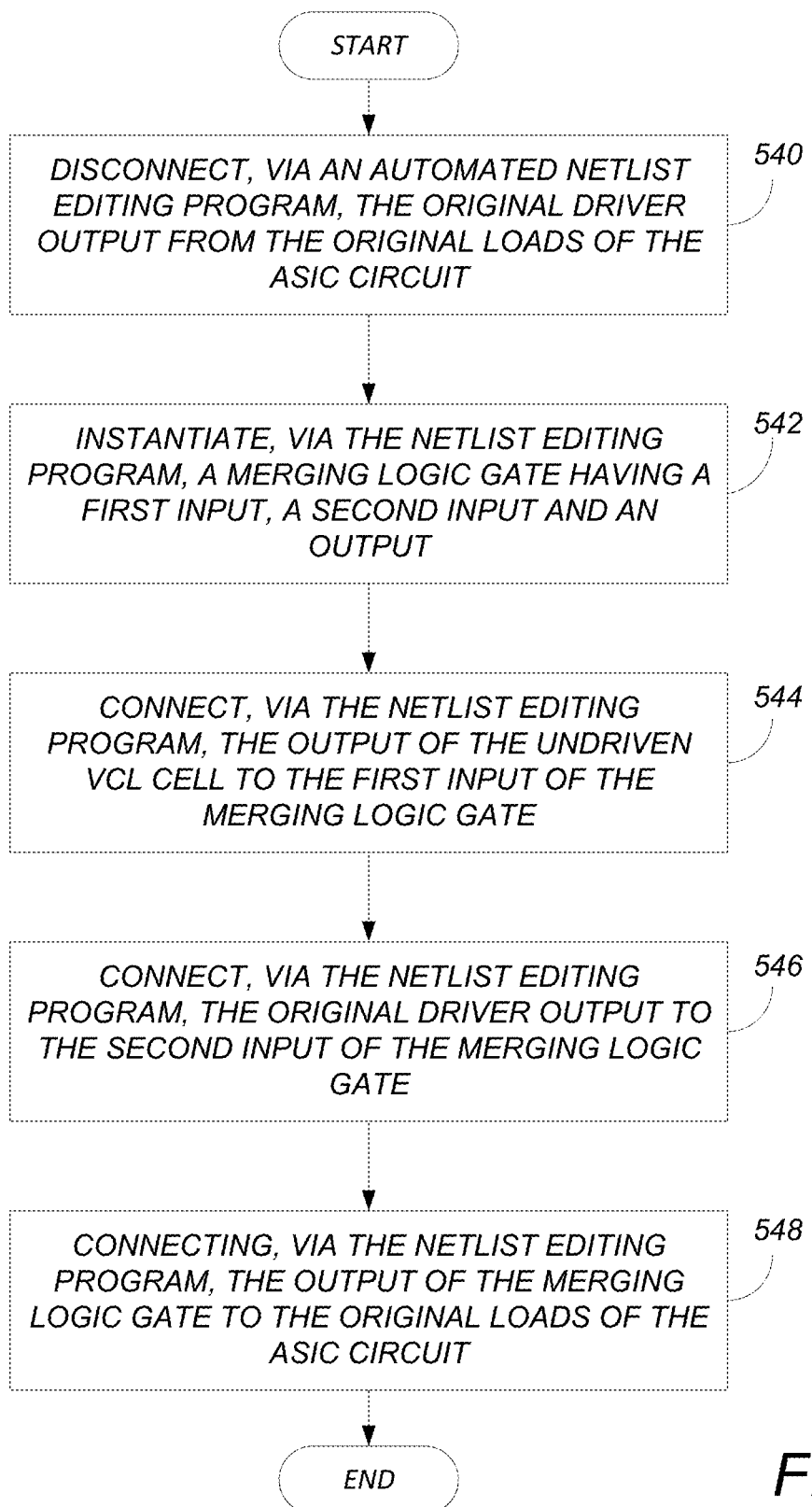

FIG. 5C is a diagram illustrating exemplary process steps used to replace the logical model of the virtual camouflage component with a gate level model of the functionally equivalent technology-dependent camouflaged component in cases where the virtual camouflage component is an undriven VCL cell 316. This embodiment is analogous to the example presented in FIGS. 3A-3C above. In this embodiment, the ASIC comprises an original driver output (e.g. carry output CO of half adder 310) communicatively coupled to an original load (e.g. D input of carry register 314) of the ASIC. In block 540, the original driver output (CO) is disconnected from the original loads (e.g. D) of the ASIC using the automated netlist editing program. In block 542, a merging logic gate 324 is instantiated using the netlist editing program. The merging logic gate 324 has a first input, a second input, and an output. Next, in block 544, the output of the undriven VCL cell 322 (Z) is connected to the first input of the merging logic gate 324. In block 546, the original driver output CO is connected to the second input of the merging logic gate 324. Finally, in block 548, the output of the merging logic gate 324 is connected to the original loads D of the ASIC.

In one embodiment, the functionally equivalent technology-dependent camouflaged component drives a source voltage VSS and wherein the merging logic gate comprises an OR2 gate or an XOR2 gate. In another embodiment, the functionally equivalent technology-dependent camouflaged component drives a source voltage VSS and wherein the merging logic gate comprises an OR2 gate or an XOR2 gate. Finally, the don't care inputs of the undriven VCL cell is connected to the other nodes of the ASIC using the netlist editing program.

Hardware Environment

Figure 6:
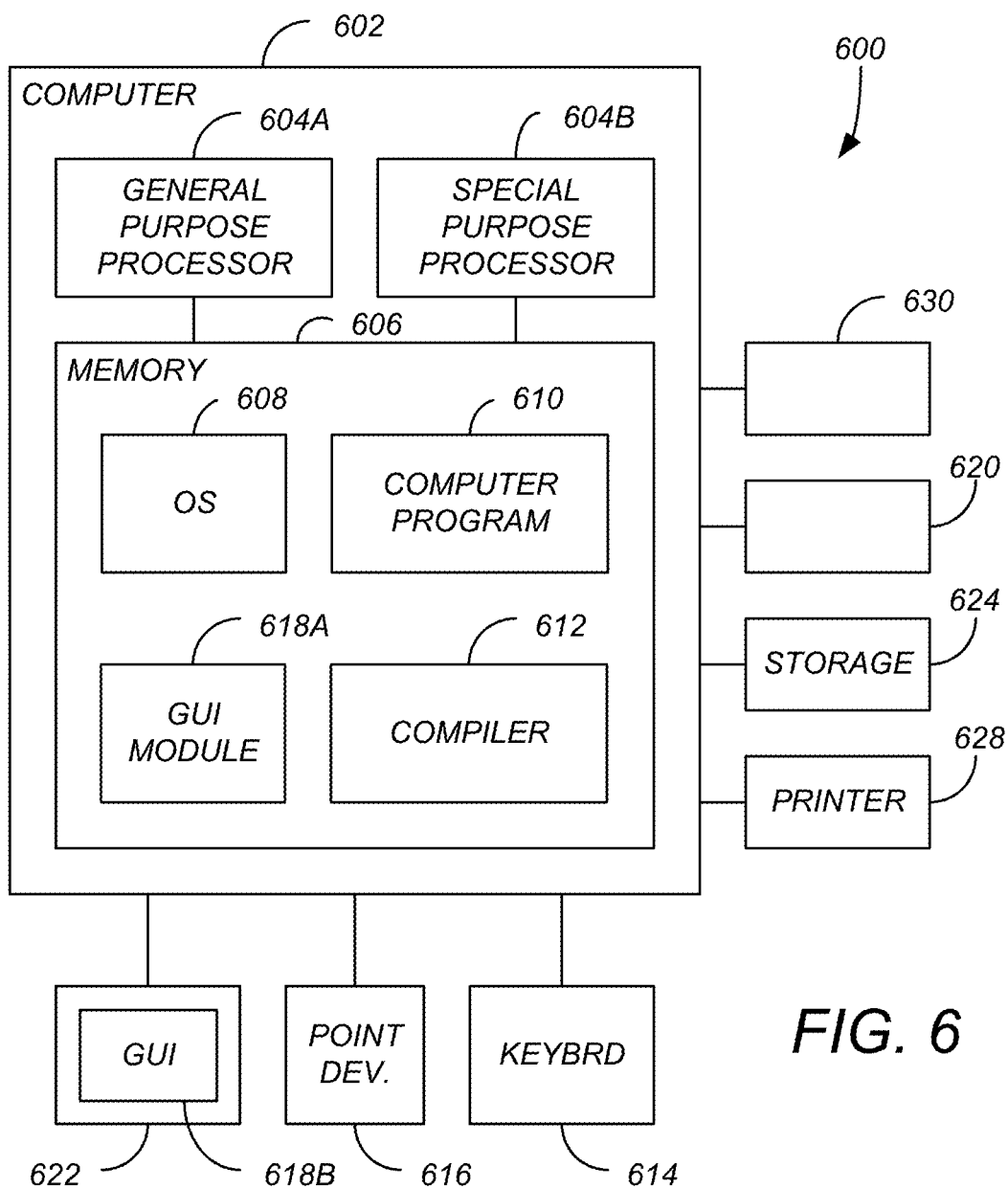
FIG. 6 is a diagram illustrating an exemplary computer system that could be used to implement elements of the present invention.

FIG. 6 is a diagram illustrating an exemplary computer system 600 that could be used to implement elements of the present invention. The computer 602 comprises a general purpose hardware processor 604A and/or a special purpose hardware processor 604B (hereinafter alternatively collectively referred to as processor 604) and a memory 606, such as random access memory (RAM). The computer 602 may be coupled to other devices, including input/output (I/O) devices such as a keyboard 614, a mouse device 616 and a printer 628.

In one embodiment, the computer 602 operates by the general purpose processor 604A performing instructions defined by the computer program 610 under control of an operating system 608. The computer program 610 and/or the operating system 608 may be stored in the memory 606 and may interface with the user and/or other devices to accept input and commands and, based on such input and commands and the instructions defined by the computer program 610 and operating system 608 to provide output and results.

Output/results may be presented on the display 622 or provided to another device for presentation or further processing or action. In one embodiment, the display 622 comprises a liquid crystal display (LCD) having a plurality of separately addressable pixels formed by liquid crystals. Each pixel of the display 622 changes to an opaque or translucent state to form a part of the image on the display in response to the data or information generated by the processor 604 from the application of the instructions of the computer program 610 and/or operating system 608 to the input and commands. Other display 622 types also include picture elements that change state in order to create the image presented on the display 622. The image may be provided through a graphical user interface (GUI) module 618A. Although the GUI module 618A is depicted as a separate module, the instructions performing the GUI functions can be resident or distributed in the operating system 608, the computer program 610, or implemented with special purpose memory and processors.

Some or all of the operations performed by the computer 602 according to the computer program 610 instructions may be implemented in a special purpose processor 604B. In this embodiment, some or all of the computer program 610 instructions may be implemented via firmware instructions stored in a read only memory (ROM), a programmable read only memory (PROM) or flash memory within the special purpose processor 604B or in memory 606. The special purpose processor 604B may also be hardwired through circuit design to perform some or all of the operations to implement the present invention. Further, the special purpose processor 604B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 602 may also implement a compiler 612 which allows an application program 610 written in a programming language such as COBOL, C++, FORTRAN, or other language to be translated into processor 604 readable code. After completion, the application or computer program 610 accesses and manipulates data accepted from I/O devices and stored in the memory 606 of the computer 602 using the relationships and logic that was generated using the compiler 612.

The computer 602 also optionally comprises an external communication device such as a modem, satellite link, Ethernet card, or other device for accepting input from and providing output to other computers.

In one embodiment, instructions implementing the operating system 608, the computer program 610, and/or the compiler 612 are tangibly embodied in a computer-readable medium, e.g., data storage device 620, which could include one or more fixed or removable data storage devices, such as a zip drive, floppy disc drive 624, hard drive, CD-ROM drive, tape drive, or a flash drive. Further, the operating system 608 and the computer program 610 are comprised of computer program instructions which, when accessed, read and executed by the computer 602, causes the computer 602 to perform the steps necessary to implement and/or use the present invention or to load the program of instructions into a memory, thus creating a special purpose data structure causing the computer to operate as a specially programmed computer executing the method steps described herein. Computer program 610 and/or operating instructions may also be tangibly embodied in memory 606 and/or data communications devices 630, thereby making a computer program product or article of manufacture according to the invention. As such, the terms "article of manufacture," "program storage device" and "computer program product" or "computer readable storage device" as used herein are intended to encompass a computer program accessible from any computer readable device or media.

Of course, those skilled in the art will recognize that any combination of the above components, or any number of different components, peripherals, and other devices, may be used with the computer 602.

Although the term "computer" is referred to herein, it is understood that the computer may include portable devices such as cellphones, portable MP3 players, video game consoles, notebook computers, pocket computers, or any other device with suitable processing, communication, and input/output capability.

Conclusion

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A computer-implemented method of camouflaging an application specific integrated circuit (ASIC), wherein the ASIC comprises a circuit comprising a plurality of interconnected functional logic cells performing a logical function, the method comprising steps of:
   accepting a coded description of the circuit, wherein the coded description describes the circuit in terms of components comprising a sequential logic component and a virtual camouflage component;
   generating a logical description of the circuit, the logical description of the circuit comprising a logical description of the virtual camouflage component; and
   replacing, in the logical description of the circuit, the logical description of the virtual camouflage component with a logical description of a functionally equivalent technology-dependent camouflaged component.

2. The method of claim 1, wherein:
   the generating a logical description of the circuit comprises:
      generating a technology specific pre-replacement netlist of gate-level components of the circuit including a logical model of the virtual camouflage component; and
   the replacing, in the logical description of the circuit, the logical description of the virtual camouflage component with a logical description of a functionally equivalent technology-dependent camouflaged component comprises:
      replacing, in the technology specific pre-replacement netlist of gate-level components, the logical model of the virtual camouflage component with a gate-level model of the functionally equivalent technology-dependent camouflaged component.

3. The method of claim 2, wherein:
   the generating the logical description of the circuit comprises any one or more of a logic synthesis, restructuring, and optimization of the coded description of the circuit; and
   the virtual camouflage component has an attribute that excludes the virtual camouflage component from the any one or more of the logic synthesis, restructuring, and optimization of the coded description of the circuit.

4. The method of claim 3, wherein:
   the virtual camouflage component is selected from a virtual camouflage cell library (VCL), the VCL having a plurality of VCL cells including at least one of a driven VCL cell and an undriven VCL cell.

5. The method of claim 4, wherein:

the virtual camouflage component is a driven VCL cell;

the replacing, in the technology specific pre-replacement netlist, the logical model of the virtual camouflage component with a gate-level model of the functionally equivalent technology-dependent camouflaged component comprises:

swapping, via an automated netlist editing program, the logical model of the virtual camouflage component with the gate-level model of the functionally equivalent technology-dependent camouflaged component;

identifying unconnected don't-care inputs of the functionally equivalent technology-dependent camouflaged component; and connecting the unconnected don't care inputs to additional nodes within the circuit.

6. The method of claim 4, wherein:

the virtual camouflage component is an undriven VCL cell;

the ASIC comprises an original driver output communicatively coupled to an original load of the ASIC and a camouflaged input of the undriven VCL cell;

the replacing, in the technology specific pre-replacement netlist, the logical model of the virtual camouflage component with a gate-level model of the functionally equivalent technology-dependent camouflaged component comprises:

disconnecting, via an automated netlist editing program, the original driver output from the original loads of the ASIC;

instantiating, via the automated netlist editing program, a merging logic gate having a first input, a second input and an output;

connecting, via the automated netlist editing program, the output of the functionally equivalent technology-dependent camouflaged component to the first input of the merging logic gate;

connecting, via the automated netlist editing program, the original driver output to the second input of the merging logic gate; and connecting, via the automated netlist editing program, the output of the merging logic gate to the original loads of the ASIC.

7. The method of claim 6, wherein the functionally equivalent technology-dependent camouflaged component drives a drain voltage VDD and wherein the merging logic gate comprises and AND2 gate or an XNOR2 gate.

8. The method of claim 6, wherein the functionally equivalent technology-dependent camouflaged component drives a source voltage VSS and wherein the merging logic gate comprises an OR2 gate or an XOR2 gate.

9. The method of claim 6, further comprising:

connecting, via the automated netlist editing program, don't-care inputs of the undriven VCL cell to other nodes of the ASIC.

10. The method of claim 1, wherein the coded description of the circuit of the ASIC is a register transfer level (RTL) coded description of the ASIC.

11. An apparatus for camouflaging an application specific integrated circuit (ASIC), wherein the ASIC comprises a circuit comprising a plurality of interconnected functional logic cells performing a logical function, the apparatus comprising:

a processor;

a memory, communicatively coupled to the processor, the memory storing processor instructions comprising instructions for:

accepting a coded description of the circuit, wherein the coded description describes the circuit in terms of components comprising sequential logic components and combinatorial logic components, and at least one virtual camouflage component;

generating a logical description of the circuit, the logical description of the circuit comprising a logical description of said at least one virtual camouflaged component; and replacing, in the logical description of the circuit, the logical description of said at least one virtual camouflaged component with a logical description of a functionally equivalent technology-dependent camouflaged component.

12. The apparatus of claim 11, wherein:

the instructions for generating a logical description of the circuit comprise:

instructions for generating a technology-specific pre-replacement netlist of gate-level components of the circuit including a logical model of the virtual camouflage component; and the instructions for replacing, in the logical description of the circuit, the logical description of the virtual camouflage component with a logical description of a functionally equivalent technology-dependent camouflaged component comprises:

instructions for replacing, in the technology specific pre-replacement netlist of gate-level components, the logical model of the virtual camouflage component with a gate-level model of the functionally equivalent technology-dependent camouflaged component.

13. The apparatus of claim 12, wherein:

the generating the logical description of the circuit comprises any one or more of a logic synthesis, restructuring, and optimization of the coded description of the circuit; and the virtual camouflage component has an attribute that excludes the virtual camouflage component from the any one or more of the logic synthesis, restructuring, and optimization of the coded description of the circuit.

14. The apparatus of claim 13, wherein:

the virtual camouflage component is selected from a virtual camouflage cell library (VCL), the VCL having a plurality of VCL cells including at least one of a driven VCL cell and an undriven VCL cell.

15. The apparatus of claim 14, wherein:

the virtual camouflage component is a driven VCL cell;

the instructions for replacing, in the technology specific pre-replacement netlist, the logical model of the virtual camouflage component with a gate-level model of the functionally equivalent technology-dependent camouflaged component comprise instructions for:

swapping, via an automated netlist editing program, the logical model of the virtual camouflage component with the gate-level model of the functionally equivalent technology-dependent camouflaged component;

identifying unconnected don't-care inputs of the functionally equivalent technology-dependent camouflaged component; and connecting the unconnected don't care inputs to additional nodes within the circuit.

16. The apparatus of claim 14, wherein:

the virtual camouflage component is an undriven VCL cell;

the ASIC comprises original driver output communicatively coupled to an original load of the ASIC and a camouflaged input of the undriven VCL cell;

the instructions for the replacing, in the technology specific pre-replacement netlist, the logical model of the virtual camouflage component with a gate-level model of the functionally equivalent technology-dependent camouflaged component comprise instructions for:

disconnecting, via an automated netlist editing program, the original driver output from the original loads of the ASIC;

instantiating, via the automated netlist editing program, a merging logic gate having a first input, a second input and an output;

connecting, via the automated netlist editing program, an output of the functionally equivalent technology-dependent camouflaged component to the first input of the merging logic gate;

connecting, via the automated netlist editing program, the original driver output to the second input of the merging logic gate; and connecting, via the automated netlist editing program, the output of the merging logic gate to the original loads of the ASIC.

17. The apparatus of claim 16, wherein the functionally equivalent technology-dependent camouflaged component drives a drain voltage VDD and wherein the merging logic gate comprises and AND2 gate or an XNOR2 gate.

18. The apparatus of claim 16, wherein the functionally equivalent technology-dependent camouflaged component drives a source voltage VSS and wherein the merging logic gate comprises an OR2 gate or an XOR2 gate.

19. The apparatus of claim 16, further comprising:

connecting, via the automated netlist editing program, don't-care inputs of the undriven VCL cell to other nodes of the ASIC.

20. The apparatus of claim 11, wherein the coded description of the circuit of the ASIC is a register transfer level (RTL) coded description of the ASIC.

21. An apparatus for camouflaging an application specific integrated circuit (ASIC), wherein the ASIC comprises a circuit comprising a plurality of interconnected functional logic cells performing a logical function, the apparatus comprising:

means for accepting a coded description of the circuit, wherein the coded description describes the circuit in terms of components comprising sequential logic components and combinatorial logic components, and includes at least one virtual camouflage component;

means for generating a logical description of the circuit, the logical description of the circuit comprising a logical description of the virtual camouflage component; and means for replacing, in the logical description of the circuit, the logical description of the virtual camouflage component with a logical description of a functionally equivalent technology-dependent camouflaged component.

* * * * *